US011990897B2

United States Patent
Shima et al.

(10) Patent No.: US 11,990,897 B2
(45) Date of Patent: May 21, 2024

(54) CURRENT CONTROL DEVICE FOR CONTROL OF SUPPLY CURRENT WITH LOW-SIDE AND HIGH-SIDE SWITCH ELEMENTS AND DURATION MEASUREMENT

(71) Applicant: Hitachi Astemo, Ltd., Hitachinaka (JP)

(72) Inventors: Yasuo Shima, Hitachinaka (JP); Keishi Komoriyama, Hitachinaka (JP); Yoichiro Kobayashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 296 days.

(21) Appl. No.: 17/613,326

(22) PCT Filed: May 22, 2020

(86) PCT No.: PCT/JP2020/020233
§ 371 (c)(1),
(2) Date: Nov. 22, 2021

(87) PCT Pub. No.: WO2020/241469
PCT Pub. Date: Dec. 3, 2020

(65) Prior Publication Data
US 2022/0230794 A1 Jul. 21, 2022

(30) Foreign Application Priority Data

May 28, 2019 (JP) ................. 2019-099725

(51) Int. Cl.
*H01H 47/32* (2006.01)
*H01F 7/18* (2006.01)
*H03K 17/687* (2006.01)

(52) U.S. Cl.
CPC ....... *H03K 17/6874* (2013.01); *H01F 7/1844* (2013.01); *H01H 47/325* (2013.01);
(Continued)

(58) Field of Classification Search
CPC .................. H01F 7/1844; H01H 47/325; H03K 17/6874; H03K 2217/0063; H03K 2217/0072
See application file for complete search history.

(56) References Cited

U.S. PATENT DOCUMENTS

2008/0061755 A1   3/2008   Michishita
2012/0319499 A1*  12/2012  Ooishi ................. H02M 3/156
                                                        307/104
(Continued)

FOREIGN PATENT DOCUMENTS

JP    2008-067495 A    3/2008
JP    2012-085038 A    4/2012
(Continued)

OTHER PUBLICATIONS

International Search Report with English translation and Written Opinion issued in corresponding application No. PCT/JP2020/020233 dated Aug. 18, 2020.

*Primary Examiner* — Harry R Behm
(74) *Attorney, Agent, or Firm* — Foley & Lardner LLP (57) ABSTRACT

Provided is a current control device capable of continuing feedback control for a solenoid in normal feedback control while preventing occurrence of an unintended valve operation due to flow of a reverse current.

11 Claims, 10 Drawing Sheets

(52) U.S. Cl.
CPC ............... *H03K 2217/0063* (2013.01); *H03K 2217/0072* (2013.01)

(56) References Cited

U.S. PATENT DOCUMENTS

| | | |
|---|---|---|
| 2015/0249447 A1 | 9/2015 | Wu et al. |
| 2018/0212419 A1 | 7/2018 | Yamashita et al. |
| 2018/0241298 A1* | 8/2018 | Reinisch ............... H01F 7/1844 |

FOREIGN PATENT DOCUMENTS

| | | | |
|---|---|---|---|
| JP | 2017-135498 A | | 8/2017 |
| JP | 2019-002360 A | | 1/2019 |
| WO | WO-2005/091482 A1 | | 9/2005 |
| WO | WO-2017/057682 A | | 4/2017 |

\* cited by examiner

CURRENT CONTROL DEVICE FOR CONTROL OF SUPPLY CURRENT WITH LOW-SIDE AND HIGH-SIDE SWITCH ELEMENTS AND DURATION MEASUREMENT

TECHNICAL FIELD

The present invention relates to a current control device, and more particularly to a current control device that controls a current flowing through a solenoid that is an inductive load.

BACKGROUND ART

A current control device for a solenoid, used in a vehicle automatic transmission or the like, measures a current value flowing through the solenoid, and controls the current by performing feedback to a pulse width modulation signal (hereinafter, referred to as PWM signal) for adjusting ON and OFF timings of a switch element controlling energization to the solenoid such that the measured current value matches a desired current value.

Figure 9:
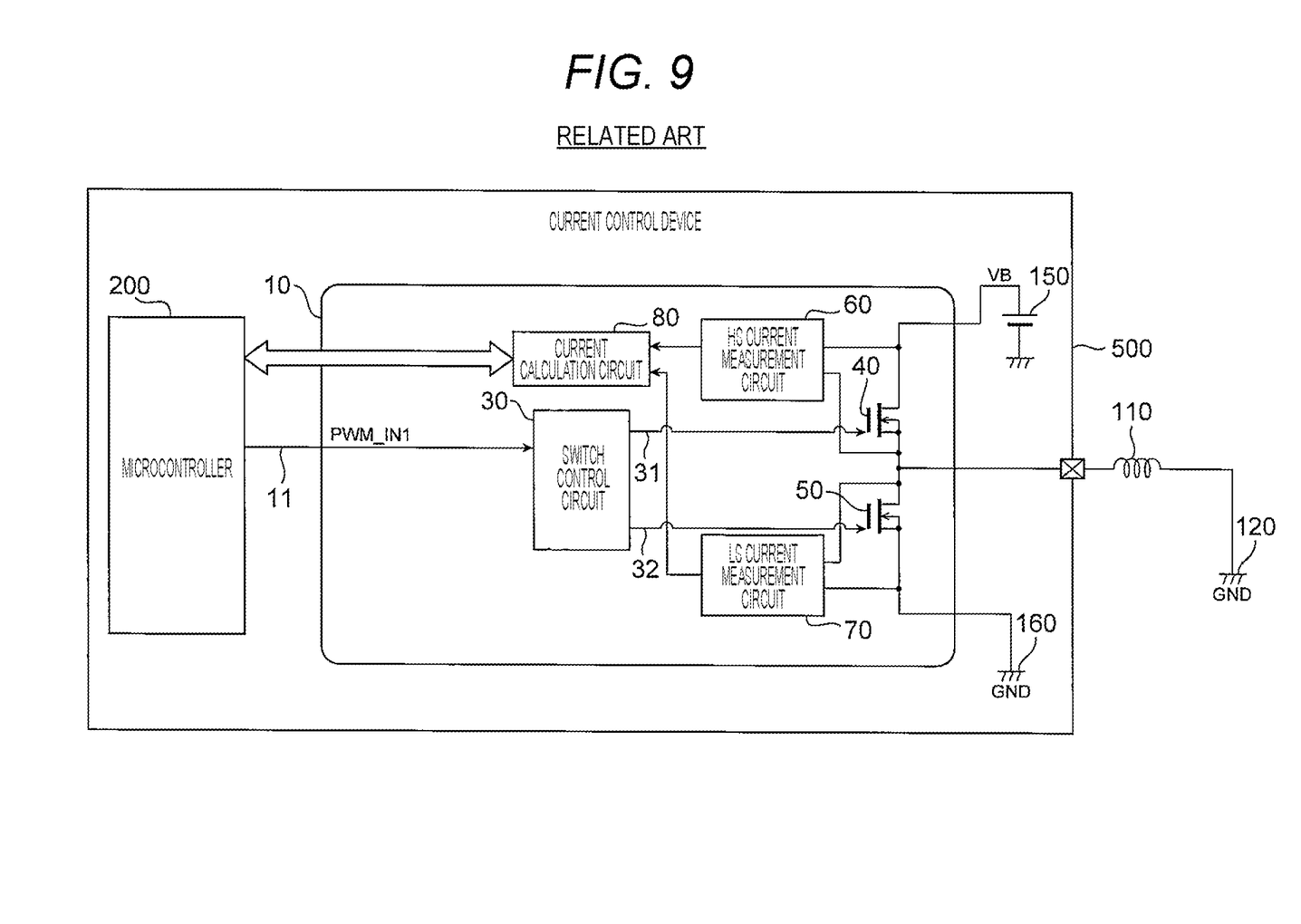
FIG. 9 is a configuration diagram of a conventional current control device.

FIG. 9 illustrates a conventional example of the current control device. A conventional current control device 500 illustrated in FIG. 9 is configured such that one end of a solenoid 110 is connected to a connection point between a high-side switch element 40 and a low-side switch element 50 connected in series to a battery power source (VB) 150, and the other end of the solenoid 110 is connected to a ground power source (GND) 120, thereby exclusively performing ON and OFF control of the high-side switch element 40 and the low-side switch element 50 according to a PWM signal (PMW_IN1) 11 from a microcontroller (hereinafter, sometimes referred to as microcomputer) 200 and supplying a current to the solenoid 110. When the PWM signal 11 is at a high level, the high-side switch element 40 is turned on, and the low-side switch element 50 is turned off, so that the battery power source 150 supplies the current to the solenoid 110 via the high-side switch element 40. On the other hand, when the PWM signal 11 is at a low level, the low-side switch element 50 is turned on, and the high-side switch element 40 is turned off, so that the current supply from the battery power source 150 is stopped. Here, when the current supplied from the battery power source 150 is cut off, a counter electromotive force is generated in the solenoid 110. Thus, the current is supplied from a ground power source (GND) 160 via the low-side switch element 50, and the energy accumulated in the solenoid 110 is released. The current supplied to the solenoid 110 is supplied via the high-side switch element 40 or the low-side switch element 50 according to the polarity of the PWM signal 11, and the supplied current is controlled by adjusting a high-level time of the PWM signal 11÷a PWM signal cycle (hereinafter, referred to as a duty ratio).

Such a current control device 500 typically includes: a high-side (HS) current measurement circuit 60 that detects and measures a current value flowing through the solenoid 110 via the high-side switch element 40; a low-side (LS) current measurement circuit 70 that detects and measures a current value flowing through the solenoid 110 via the low-side switch element 50; a current calculation circuit 80 that obtains an average current value for a certain period necessary for feedback control based on current detection results of the HS current measurement circuit 60 and the LS current measurement circuit 70 and transfers the average current value to the microcomputer 200; and a switch control circuit 30 that receives the PWM signal (PMW_IN1) 11 from the microcomputer 200, generates a high-side switch element control PWM signal 31 for the high-side switch element 40 (hereinafter, simply referred to as PWM signal 31) and a low-side switch element control PWM signal 32 for the low-side switch element 50 (hereinafter, simply referred to as PWM signal 32), and executes switch control (also referred to as gate control) to turn on and off the high-side switch element 40 and the low-side switch element 50. The high-side switch element 40, the low-side switch element 50, and the above-described various circuits constitute a load drive circuit (synchronous rectification circuit) 10 that supplies a current to the solenoid 110 which is an inductive load.

In addition, it is also known that a load drive circuit corresponding to each solenoid is provided in the current control device 500 in a case where a plurality of solenoids are controlled by the current control device 500 (see, for example, PTL 1 below).

CITATION LIST

Patent Literature

PTL 1: WO 2017/057682 A

SUMMARY OF INVENTION

Technical Problem

In a case where one end of the solenoid connected to the current control device is grounded to the ground power source, a current is supplied from the current control device to the solenoid. When the duty ratio of the PWM signal from the microcontroller is "0", the current value is the minimum value "0". Since the amount of the current supplied to the solenoid increases as the duty ratio is increased, it is difficult for such a current control device to control a current in the reverse direction from the normal direction from the solenoid to the current control device. However, when an abnormality such as disconnection of a ground line of an electronic control device or the solenoid occurs, an unintended reverse current occurs in some cases.

Figure 10:
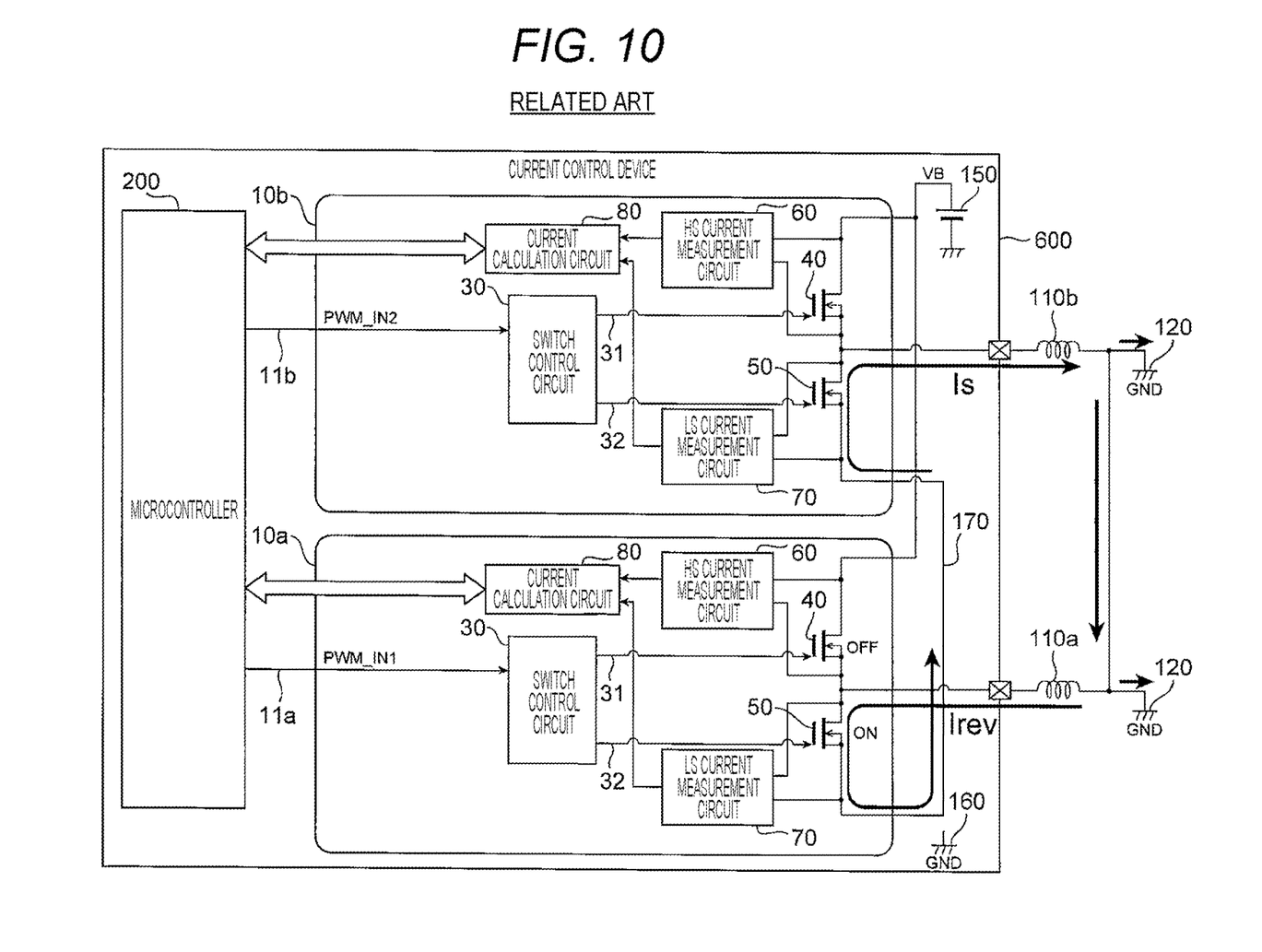
FIG. 10 is a configuration diagram illustrating an example of a problem in a conventional current control device.

FIG. 10 illustrates another conventional example of the current control device. A conventional current control device 600 illustrated in FIG. 10 controls a plurality of solenoids in which one end of each of the solenoids is connected to a common ground point (ground power source). In a case where one solenoid 110a is controlled by a PWM signal (PMW_IN1) 11a having a low duty ratio (sent from a microcomputer 200 to a load drive circuit 10a) and the other solenoid 110b is controlled by a PWM signal (PMW_IN2) 11b having a relatively high duty ratio (sent from the microcomputer 200 to a load drive circuit 10b), a node 170 connected to a ground power source 160 has a high impedance and is likely to fluctuate, for example, if the current control device 600 and the ground power source 160 are disconnected, so that a relatively large current Is from the current control device 600 to the solenoid 110b acts in a direction of decreasing a potential of the node 170. Then, a current flowing through the solenoid 110b flows from the solenoid 110a to the node 170 of the current control device 600 via a low-side switch element 50, which is kept substantially in an ON state by the PWM signal 11a having a low duty ratio, thereby generating a reverse current Irev.

Some solenoids open and close valves even by a reverse current. For example, in a solenoid that controls disconnection of a lock-up clutch, there is a possibility that an unintended lock-up is fastened by the generated reverse current to generate a shift shock.

Regarding such a problem, in the related art described in PTL 1 described above, it is determined that a disconnection abnormality of solenoids to a common ground point has occurred when a detected value of a current flowing through the solenoids is lower than an instruction value of a current or a reverse current is detected, and control is performed to stop all the solenoids. However, such a measure is taken assuming that one end of each of the solenoids has the disconnection abnormality for the common ground point, and there is a high possibility that a shift shock occurs since all the solenoids are turned off.

The present invention has been made in view of the above problems, and an object thereof is to provide a current control device capable of continuing feedback control for a solenoid in normal feedback control while preventing the occurrence of an unintended valve operation due to flow of a reverse current.

Solution to Problem

In order to solve the above problems, a current control device according to the present invention includes: a high-side switch element that electrically connects a solenoid, which has one end grounded to a ground power source, to a battery power source; a low-side switch element that electrically connects the solenoid to the ground power source; a switch control circuit that controls a supply current with respect to the solenoid by turning on one of the high-side switch element and the low-side switch element and turning off the other; and a time measurement circuit that measures an ON duration of the low-side switch element.

Advantageous Effects of Invention

According to the present invention, provided are: the high-side switch element that electrically connects the solenoid, which has one end grounded to the ground power source, to the battery power source; the low-side switch element that electrically connects the solenoid to the ground power source; the switch control circuit that controls the supply current with respect to the solenoid by turning on one of the high-side switch element and the low-side switch element and turning off the other; and the time measurement circuit that measures the ON duration of the low-side switch element. When the ON duration of the low-side switch element measured by the time measurement circuit reaches a predetermined time, the switch control circuit temporarily turns off the low-side switch element while keeping the high-side switch element off.

That is, in a case where the current to be supplied to the solenoid is controlled by a PWM signal having a low duty ratio, in particular, by a PWM signal having a duty ratio corresponding to an instruction current value of the current "0", if a certain time elapses in such a state, the low-side switch element is temporarily turned off, and a current path in the reverse direction is cut off in advance in order to prevent a reverse current. If a PWM signal indicating that the instruction current value is not "0" but is a certain value or more is received, the fixation of the low-side switch element in the OFF state is released to return to a normal synchronous rectification operation in which either the high-side switch element or the low-side switch element is turned on.

As a result, the path of the reverse current of the solenoid is cut off by a simpler method, and feedback control can be continued for the solenoid capable of performing normal feedback control while preventing the occurrence of an unintended valve operation due to the flow of the reverse current. As a result, in the solenoid that controls disconnection of a lock-up clutch, it is possible to suppress the occurrence of a shift shock while preventing fastening of an unintended lock-up when a ground line is disconnected, for example.

Other objects, configurations, and effects which have not been described above become apparent from embodiments to be described hereinafter.

DESCRIPTION OF EMBODIMENTS

Hereinafter, embodiments of the present invention will be described with reference to the drawings. Incidentally, a technical scope of the present invention should not be narrowly interpreted based on the description of the drawings since the drawings are simplified. In addition, the same elements are denoted by the same reference signs in the description of the present specification, and redundant descriptions thereof are omitted.

First Embodiment

Figure 1:
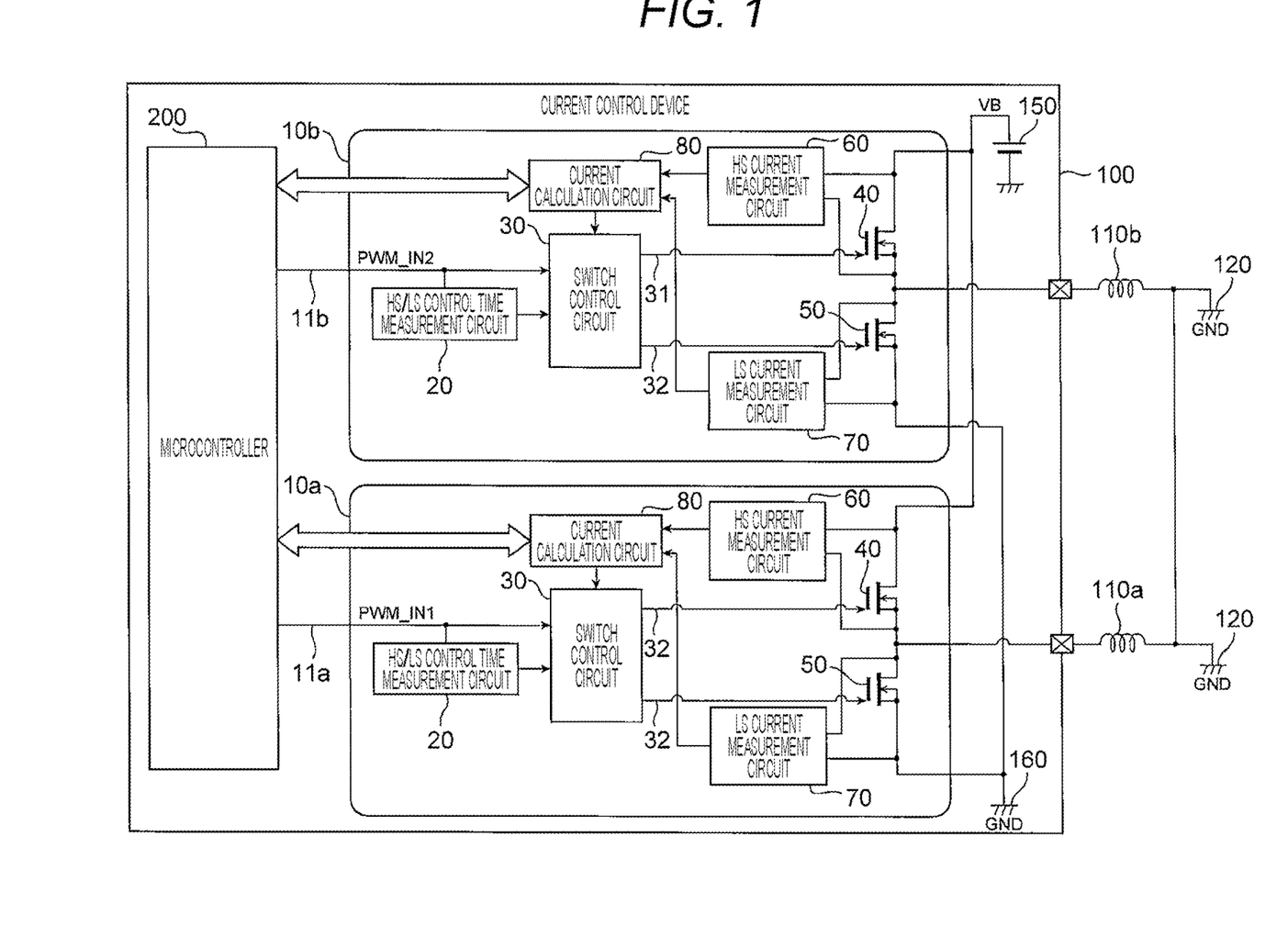
FIG. 1 is a configuration diagram illustrating a first embodiment of the present invention.

FIG. 1 is a configuration diagram of a current control device for a vehicle automatic transmission according to a first embodiment of the present invention.

A current control device 100 of the illustrated embodiment includes a microcomputer 200 and load drive circuits 10a and 10b that supply currents to a plurality of solenoids 110a and 110b. Here, the number of the plurality of solenoids and the number of the load drive circuits are omitted to two (two sets) for the simplification of the drawing, but the number is not limited. In addition, in both of the load drive circuits 10a and 10b, one end of each of the solenoids 110a and 110b that supplies a current is connected to a connection point between a high-side switch element 40 and a low-side switch element 50 connected in series to a battery power source (VB) 150, and the other end of each of the solenoids 110a and 110b is connected (grounded) to a common ground power source (GND) 120. The microcomputer 200 calculates currents to be supplied to the solenoids 110a and 110b necessary for a vehicle automatic transmission system, and outputs PWM signals 11a and 11b for controlling ON and OFF timings of the high-side switch element 40 and the low-side switch element 50 to the load drive circuits 10a and 10b using values of the currents as instruction current values.

Since a configuration and an operation of each of the load drive circuit 10a and the load drive circuit 10b are basically the same, the configuration and operation of the load drive circuit 10a provided for the solenoid 110a will be mainly described hereinafter.

When the PWM signal 11a is at a high level by a switch control circuit 30, the load drive circuit 10a that has received the PWM signal 11a generates PWM signals 31 and 32 so as to turn on the high-side switch element 40 and turn off the low-side switch element 50, and supplies a current from the battery power source 150 to the solenoid 110a via the high-side switch element 40. On the other hand, when the PWM signal 11a is at a low level, the PWM signals 31 and 32 are generated so as to turn off the high-side switch element 40 and turn on the low-side switch element 50, the current supply from the battery power source 150 is cut off, and energy accumulated in the solenoid 110a is discharged by supplying a current from a ground power source (GND) 160 to the solenoid 110a via the low-side switch element 50. Since a transition time is required for the high-side switch element 40 and the low-side switch element 50 to be switched from ON to OFF and from OFF to ON, a period (hereinafter, referred to as dead-time period) for controlling both the switch elements to be turned off is added to the PWM signals 31 and 32 at a switching timing between ON and OFF such that both the high-side switch element 40 and the low-side switch element 50 are not turned on. As a result, the current supplied to the solenoid 110a can be increased or decreased by changing a duty ratio of the PWM signal 11a, and the supply current with respect to the solenoid 110a is controlled by performing feedback control so as to correct a difference between the instruction current value calculated by the microcomputer 200 and the current value flowing through the solenoid 110a for the PWM signal 11a of the duty ratio. The current value flowing through the solenoid 110a is detected by an HS current measurement circuit 60 and an LS current measurement circuit 70 for each of the high-side switch element 40 and the low-side switch element 50. A current calculation circuit 80 effectively obtains an average current value for a certain period required for the feedback control based on a result of the current detection, and transfers the average current value to the microcomputer 200.

In addition to the above configuration, in the first embodiment, an HS/LS control time measurement circuit 20 that measures a high-level period and a low-level period of the PWM signal 11a is provided in order to measure ON (or OFF) control times (also referred to as ON durations) of the high-side switch element 40 and the low-side switch element 50. For example, a reverse current is unintentionally generated from the solenoid 110a to the current control device 100 due to disconnection of a GND connection line of the current control device 100 or the like in a period in which the low-side switch element 50 is turned on, and in a case where the current value supplied to the solenoid 110a is small. In particular, such a risk increases if the instruction current value of the solenoid 110a is near "0". Therefore, the high-level period and the low-level period of the PWM signal 11a are measured by the HS/LS control time measurement circuit 20, and when an ON period of the low-side switch element 50 with the PWM signal 11a is sufficiently long and the instruction current value is recognized as "0", the low-side switch element 50 is temporarily turned off by the switch control circuit 30 to prevent the generation of the reverse current in advance.

Here, the HS/LS control time measurement circuit 20 may measure an ON control time (ON duration) of low-side switch element 50 to be used for control or measure an OFF control time (OFF duration) of the high-side switch element 40 to detect the ON control time (ON duration) of the low-side switch element 50 from the OFF control time.

Figure 2:
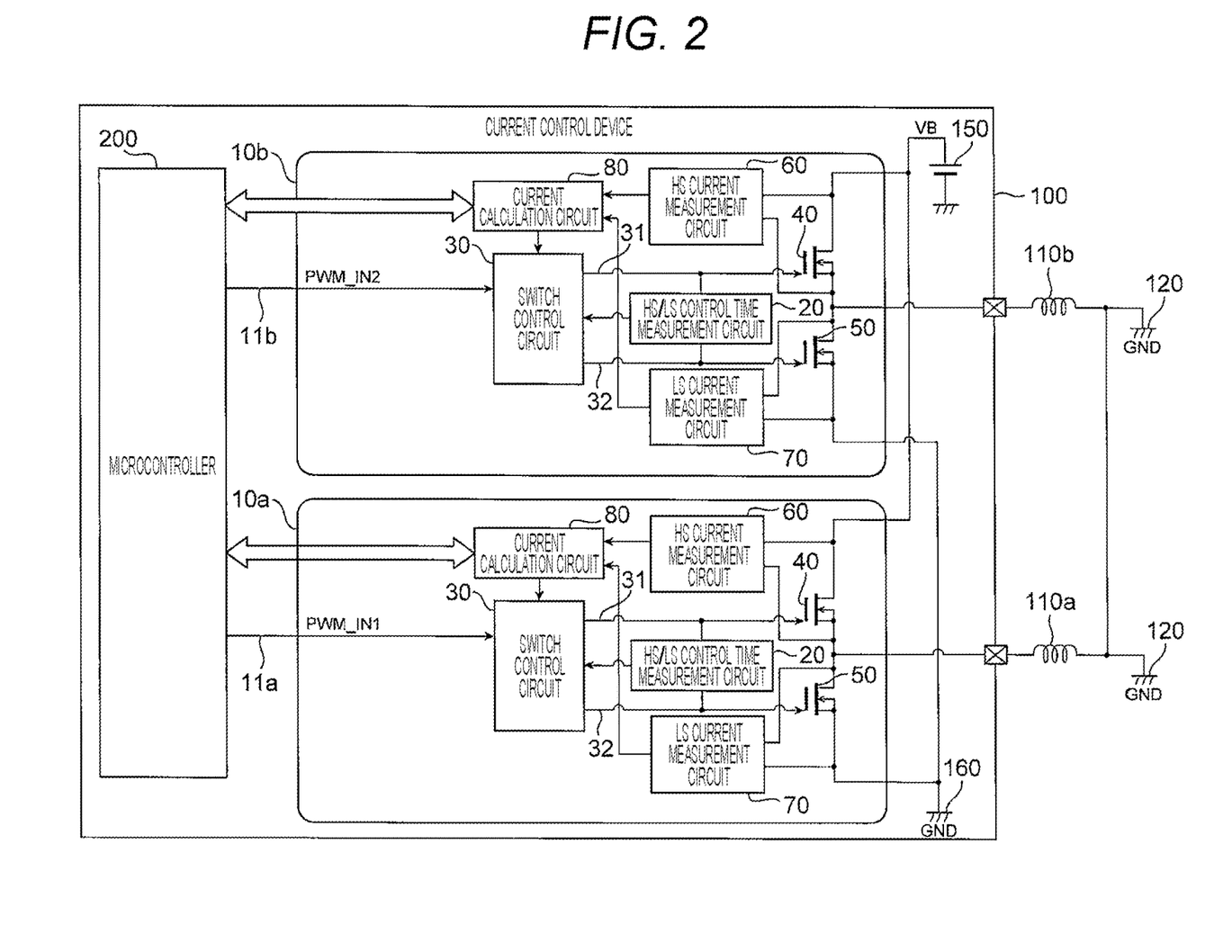
FIG. 2 is a configuration diagram illustrating a modification of the first embodiment of the present invention.

Incidentally, the HS/LS control time measurement circuit 20 is installed for the PWM signal 11a (that is, in the upstream side of the switch control circuit 30) in FIG. 1, but may be installed for the PWM signal 31 and the PWM signal 32 (that is, between the switch control circuit 30, and the high-side switch element 40 and the low-side switch element 50) as illustrated in FIG. 2 in consideration of a control timing as long as the ON (or OFF) control times of the high-side switch element 40 and the low-side switch element 50 can be measured. In the example illustrated in FIG. 1, the ON (or OFF) control time can be measured earlier. In the example illustrated in FIG. 2, the ON (or OFF) control time can be measured more accurately.

Figure 3:
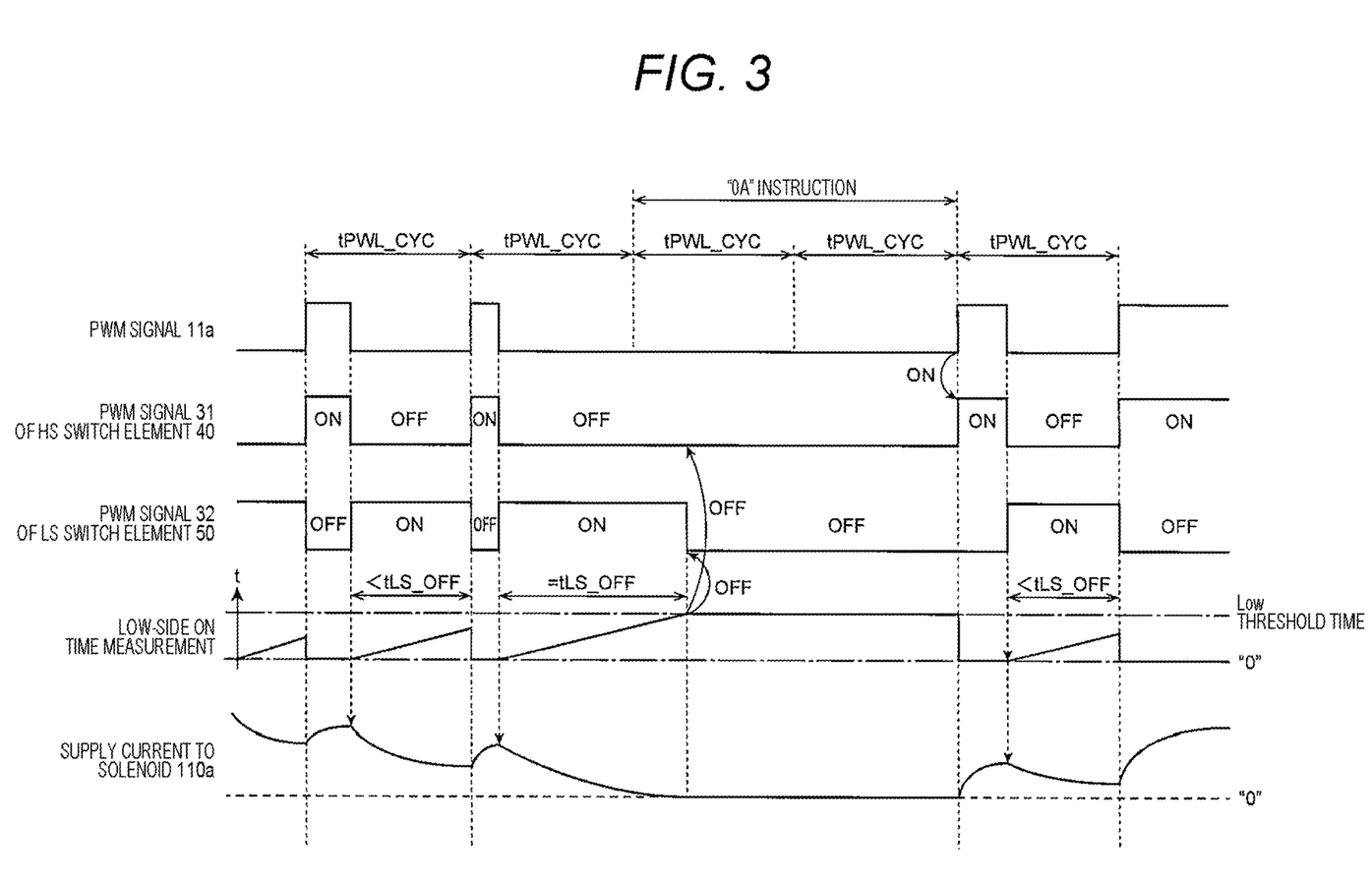
FIG. 3 is a view illustrating a first operation waveform example of the first embodiment of the present invention.

FIG. 3 is an operation timing chart of a function of preventing generation of a reverse current in the first embodiment. Incidentally, the description of the dead-time period is omitted for the PWM signals 31 and 32, which are control signals of the high-side switch element 40 and the low-side switch element 50 for the sake of simplicity. FIG. 3 first illustrates the simplest example in which the duty ratio of the PWM signal 11a becomes zero when the instruction current value is "0".

The PWM signal 11a is controlled with a cycle tPWM_CYC, and one of the high-side switch element 40 and the low-side switch element 50 is (exclusively) turned on by the switch control circuit 30 according to the polarity of the PWM signal 11a to control the current supplied to the solenoid 110a. Here, the HS/LS control time measurement circuit 20 measures the low-level period corresponding to the ON time of the low-side switch element 50 every time the PWM signal 11a is switched from the high level to the low level (in FIG. 3, low-side ON time measurement). If the low-level period of the PWM signal 11a becomes longer than a certain threshold time tLS_OFF, the PWM signal 32 is negated, the switch control circuit 30 performs control to turn off both the high-side switch element 40 and the low-side switch element 50 (in other words, performs control to turn off the low-side switch element 50 while keeping the high-side switch element 40 off), thereby preventing the generation of the reverse current in advance. If the threshold time tLS_OFF for which the low-side switch element 50 is temporarily turned off is set to be equal to or longer than the ON/OFF switching cycle tPWM_CYC of the low-side switch element 50 and the high-side switch element 40, this function can be enabled only when the duty ratio of the PWM signal 11a with the instruction current value of "0" becomes "0". A state where both the high-side switch element 40 and the low-side switch element 50 are temporarily turned off is continued until the PWM signal 11a is switched to the high level (that is, until the PWM signal 11a as a control command for turning on the high-side switch element 40 is generated and the instruction current value is no longer "0"). Thereafter, the control returns to normal PWM control (that is, a synchronous rectification operation) according to the polarity of the PWM signal 11a.

Here, regarding the threshold time tLS_OFF for the low-level period of the PWM signal 11a, it is necessary to wait until a current decreases to some extent since it is not preferable to turn off the low-side switch element 50 while a large current is supplied from the low-side switch element 50 to the solenoid 110a. This is because the low-side switch element 50 is generally formed using a metal-oxide semiconductor field-effect transistor (MOSFET), and unexpected heat generation occurs since a current flows through a parasitic diode of the MOSFET even when the switch element is turned off, and it is difficult to measure a value of the current flowing therebetween depending on the configuration of the current measurement circuit so that an error occurs in a measured current value. The current value supplied to the solenoid 110a when the low-side switch element 50 is turned on depends on an ON resistance of the low-side switch element 50, an impedance of the solenoid 110a, and the energy accumulated in the solenoid 110a while the high-side switch element 40 is turned on.

When the ON resistance of the low-side switch element 50 is Ron, the inductance of the solenoid 110a is Ls, a resistance value is Rs, and a peak current value when the high-side switch element 50 is turned on is Ipk, a current I, supplied to the solenoid 110a after a lapse of time t since switching of the low-side switch element 50 to an ON state, can be approximated by the following Formula (1).

[Formula 1]

$$I = Ipk * \exp(-(Rs+Ron)*t/Ls) \quad (1)$$

In addition, when a current value after a lapse of time t is Igoal, the time t is expressed by the following Formula (2).

[Formula 2]

$$t = Ls/(Rs+Ron) * \ln(Ipk/Igoal) \quad (2)$$

Figure 4:
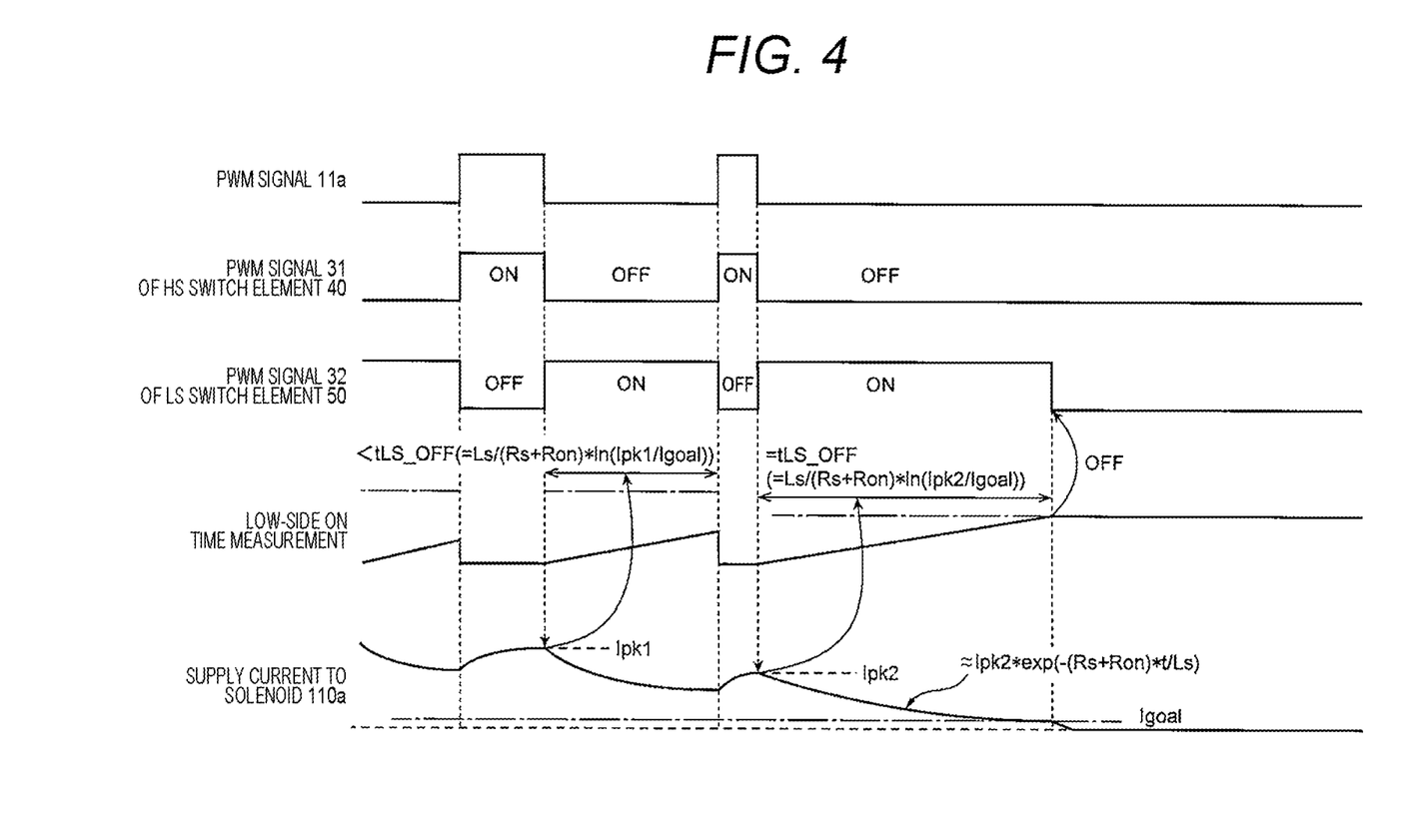
FIG. 4 is a view illustrating an operation waveform example in a case where a threshold time in FIG. 3 depends on a detected current value.
Figure 5:
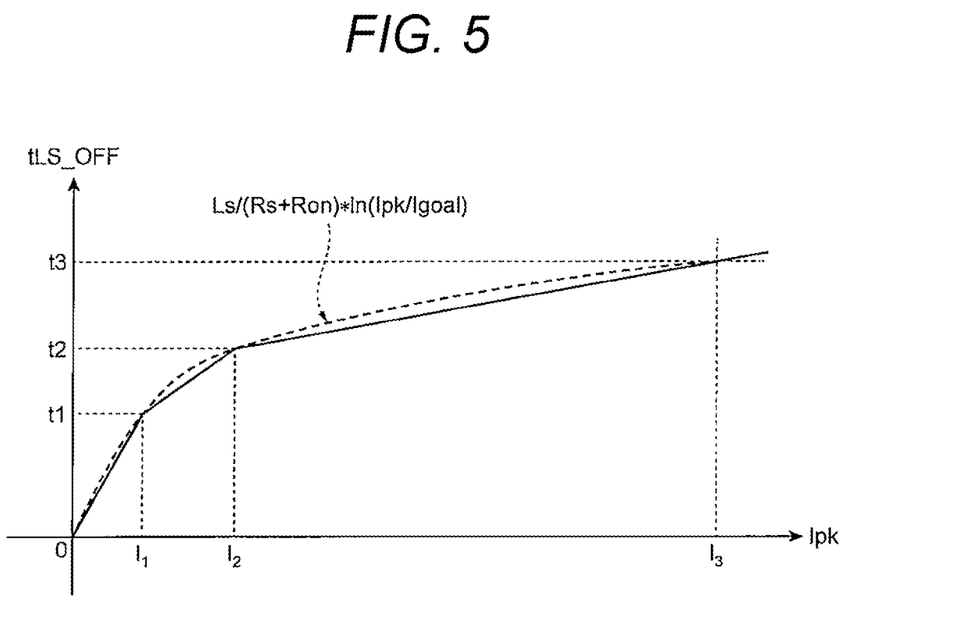
FIG. 5 is an explanatory view for simply obtaining the threshold time in FIG. 4.

Here, Ls, Rs, and Ron are known. As illustrated in FIG. 4, if current values supplied to the solenoid 110a are acquired at the timing when the PWM signal 11a is switched to the low level by the HS current measurement circuit 60 and the LS current measurement circuit 70 when the low-side switch element 50 is turned on, tLS_OFF for desired Igoal can be obtained with Ipk. It is preferable that Igoal be a value which makes a stress (current value) generated by turning off the low-side switch element 50 fall within an allowable range of a device circuit device (that is, the load drive circuit 10a of the current control device 100) and has an error that can be ignored in terms of accuracy of the measured current value. In other words, the threshold time tLS_OFF for temporarily turning off the low-side switch element 50 (tLS_OFF obtained for Igoal described above) is preferably set to a time in which the stress (current value) generated by cutting off the current flowing from the low-side switch element 50 to the solenoid 100a decreases to a current value within the allowable range of the device circuit device (that is, the load drive circuit 10a of the current control device 100). In addition, the calculation of ln( ) in the above Formula (2) can be easily realized by a method of obtaining Ipk acquired every PWM cycle by a first-order approximation formula divided into several current ranges as illustrated in FIG. 5. In addition, more simply, Ipk may be calculated assuming (fixing) a maximum current value (=battery voltage/(Rs+Ron)) at a duty ratio of 100% of the PWM signal 11a.

Figure 6:
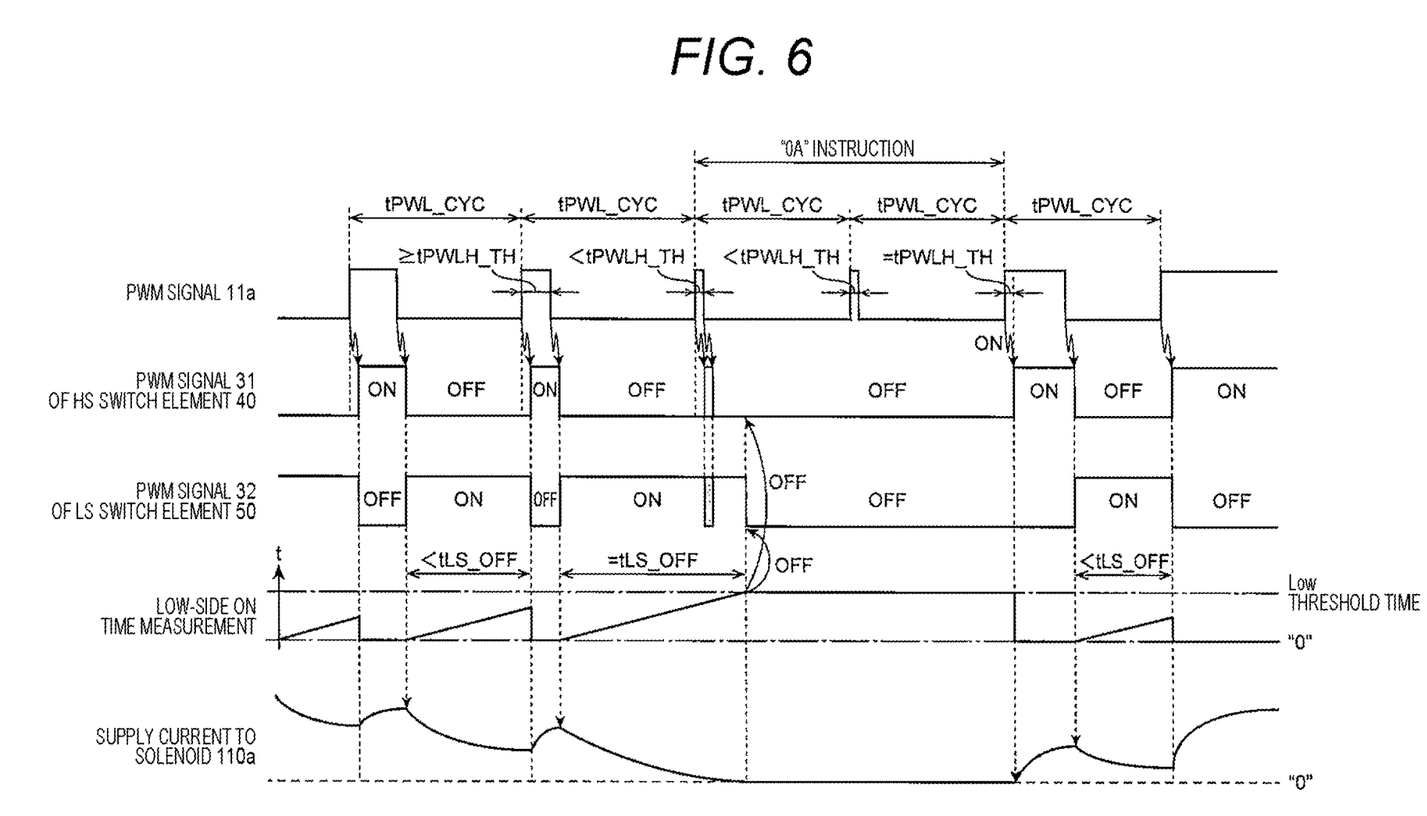
FIG. 6 is a view illustrating a second operation waveform example of the first embodiment of the present invention.

Incidentally, the case where the duty ratio of the PWM signal 11a having the instruction current value of "0" is "0" is assumed in FIG. 3 described above. However, in practice, there is a case where an extremely small duty ratio that is not "0" is held (that is, case where the PWM signal 11a as the control command for turning on the high-side switch element 40 is generated). FIG. 6 illustrates an operation timing chart of a function of preventing generation of a reverse current in a case where the duty ratio of the PWM signal 11a having the instruction current value of "0" is not "0" (case where the instruction current value is "0" but an extremely small duty ratio that is not "0" is held). Incidentally, FIG. 6 illustrates a time delay (here, tPWMLH_TH) for securing a determination time for input and output in the switch control circuit 30, that is, the PWM signals 31 and 32 with respect to the PWM signal 11a.

The PWM signal 11a is controlled with the cycle tPWM_CYC, and one of the high-side switch element 40 and the low-side switch element 50 is (exclusively) turned on by the switch control circuit 30 according to the polarity of the PWM signal 11a to control the current supplied to the solenoid 110a, which is similar to the case of FIG. 3. Here, the HS/LS control time measurement circuit 20 measures the low-level period corresponding to the ON time of the low-side switch element 50 every time the PWM signal 11a is switched from the high level to the low level as described above. However, when the instruction current value is "0" and the duty ratio of the PWM signal 11a is not "0" as in the present example, the PWM signal 11a changes to the high level every cycle tPWM_CYC. Therefore, the high-level period (that is, an ON duration of the high-side switch element 40) of the PWM signal 11a (the PWM signal 31 in the case of the example illustrated in FIG. 2) is measured by the HS/LS control time measurement circuit 20, and the measurement of the low-level period (that is, the ON duration of the low-side switch element 50) is continued as it is without being initialized (or canceled) if the measured high-level period is a time shorter than the determination threshold tPWMLH_TH of the high-level period in which it can be determined that the instruction current value is "0". That is, in this case, the determination threshold tPWMLH_TH of the high-level period (the ON duration of the high-side switch element 40) of the PWM signal 11a (the PWM signal 31 in the case of the example illustrated in FIG. 2) is set based on the ON period of the high-side switch element 40 when the current value supplied to the solenoid 110a is controlled to "0". Then, if the low-level period is longer than a certain threshold time tLS_OFF, the PWM signal 32 is negated, and the switch control circuit 30 performs control to temporarily turn off both the high-side switch element 40 and the low-side switch element 50 (in other words, performs control to turn off the low-side switch element 50 while keeping the high-side switch element 40 off), thereby preventing the generation of the reverse current in advance.

In this case, this function can be enabled only when the instruction current value becomes "0" if the threshold time tLS_OFF is set to be equal to or longer than a value obtained by adding tPWMLH_TH to the cycle tPWM_CYC and the time delay (here, tPWMLH_TH) of the PWM signals 31 and 32 with respect to the PWM signal 11a. Such a state where both the high-side switch element 40 and the low-side switch element 50 are temporarily turned off is continued until a signal that makes the high-level period of the PWM signal 11a equal to or longer than the determination threshold tPWMLH_TH is input (that is, the PWM signal 11a as the control command for turning on the high-side switch element 40 is generated for the determination threshold tPWMLH_TH or longer and the instruction current value is no longer "0"). As a result, the generation of the reverse current can be prevented in advance even in the case where the duty ratio of the PWM signal 11a is not "0" when the instruction current value is "0".

In addition, the above example is limited to the case where the instruction current value is "0", but the generation of the reverse current can be prevented in advance even for an instruction current value that is not "0" by adjusting the determination threshold tPWMLH_TH of the high-level period of the PWM signal 11a although causing a trade-off with the measurement current accuracy.

According to the present invention, provided are: the high-side switch element 40 that electrically connects each of the solenoids 110a and 110b having one ends grounded to the ground power source 120, to the battery power source 150; the low-side switch element 50 that electrically connects the solenoid to the ground power source 160; the switch control circuit 30 that controls the supply current with respect to each of the solenoids 110a and 110b by turning on one of the high-side switch element 40 and the low-side switch element 50 and turning off the other; and the HS/LS control time measurement circuit (time measurement circuit) 20 that measures the ON duration of the low-side switch element 50. When the ON duration of the low-side switch element 50 measured by the HS/LS control time measurement circuit (time measurement circuit) 20 reaches a predetermined time, the switch control circuit 30 temporarily turns off the low-side switch element 50 while keeping the high-side switch element 40 off.

That is, in a case where the currents to be supplied to the solenoids 110a and 110b are controlled by the PWM signals 11a and 11b each having a low duty ratio, in particular, by the PWM signals 11a and 11b each having a duty ratio corresponding to the instruction current value of the current "0", if a certain time elapses in such a state, the low-side switch element 50 is temporarily turned off, and the current path in the reverse direction is cut off in advance in order to prevent the reverse current. If the PWM signals 11a and 11b indicating that the instruction current value is not "0" but is a certain value or more is received, the fixation of the low-side switch element 50 in the OFF state is released to return to the normal synchronous rectification operation in which either the high-side switch element 40 or the low-side switch element 50 is turned on.

As a result, the path of the reverse current of the solenoid is cut off by a simpler method, and feedback control can be continued for the solenoid capable of performing normal feedback control while preventing the occurrence of an unintended valve operation due to the flow of the reverse current. As a result, in the solenoid that controls disconnection of a lock-up clutch, it is possible to suppress the occurrence of a shift shock while preventing fastening of an unintended lock-up when a ground line is disconnected, for example.

Second Embodiment

The above first embodiment prevents the generation of the reverse current when the instruction current value is "0" or the instruction current value is extremely small. However, even when one solenoid 110a is controlled with a certain instruction current and another solenoid 110b is operating with an extremely large current, a reverse current is sometimes generated when the low-side switch element 50 of the solenoid 110a is in an ON state. Although the reverse current is controlled to be canceled by feedback control of a current supplied to the solenoid, such control usually requires several cycles or more in units of PWM cycles. Therefore, a function of negating the PWM signal 32 when a reverse current equal to or larger than a certain determination threshold is detected, temporarily turning off the low-side switch element 50, and cutting off the reverse current may be added. This function can be installed in parallel with the function of preventing the generation of the reverse current when the instruction current value is "0" illustrated in the operation timing chart of FIGS. 3 and 6 or when the instruction current value is extremely small.

Figure 7:
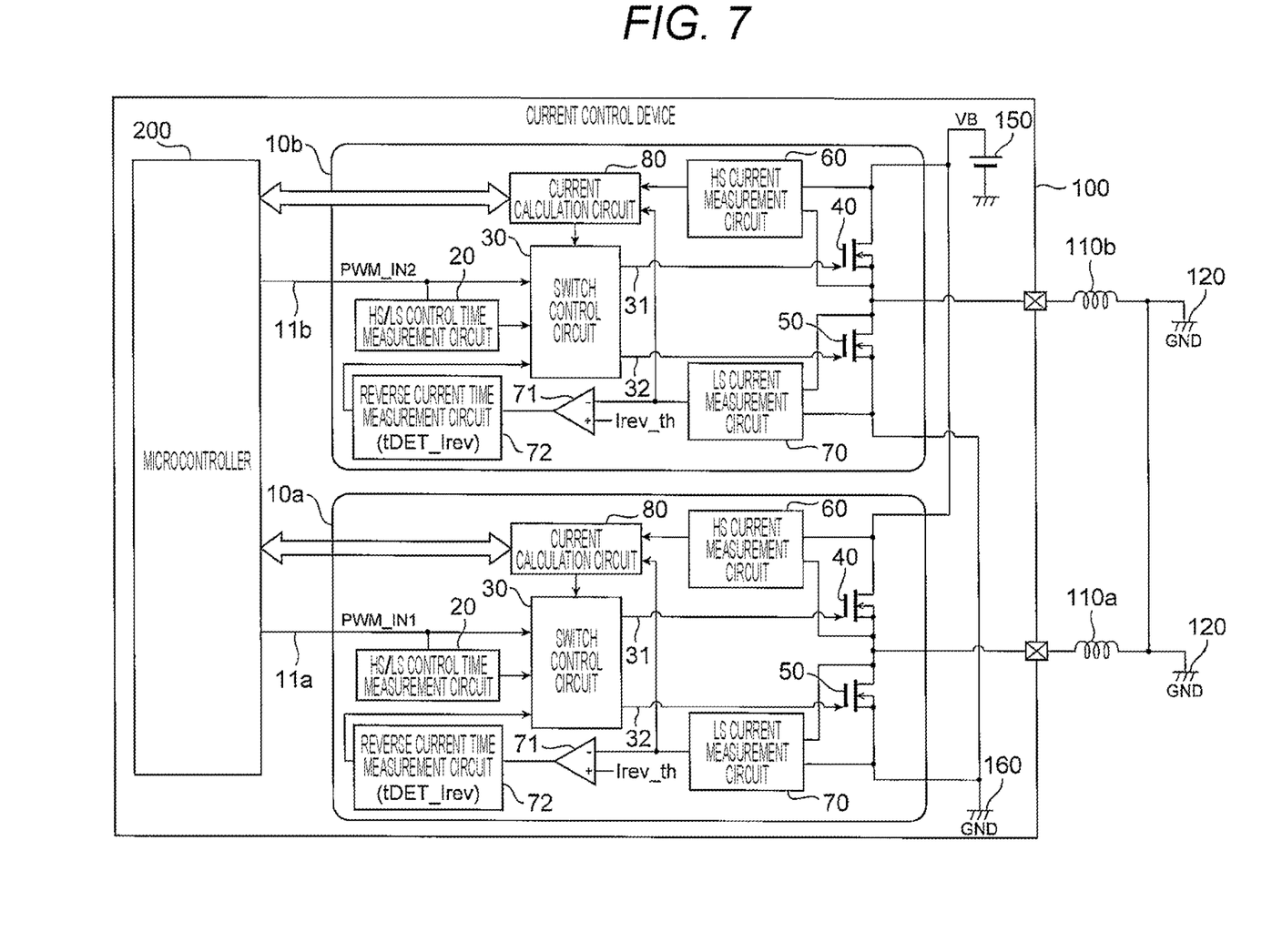
FIG. 7 is a configuration diagram illustrating a second embodiment of the present invention.

FIG. 7 is a configuration diagram of a current control device for a vehicle automatic transmission according to a second embodiment of the present invention.

In the second embodiment, a comparator 71 that detects a reverse current equal to or larger than a certain current threshold Irev_th from a current value to the solenoid 110a obtained by the LS current measurement circuit 70 and a reverse current time measurement circuit 72 that measures a generation time (period) of the reverse current are added to the above first embodiment such that a result of the measurement is input to the switch control circuit 30 and is used for switch control (also referred to as gate control) for turning on and off the high-side switch element 40 and the low-side switch element 50.

Figure 8:
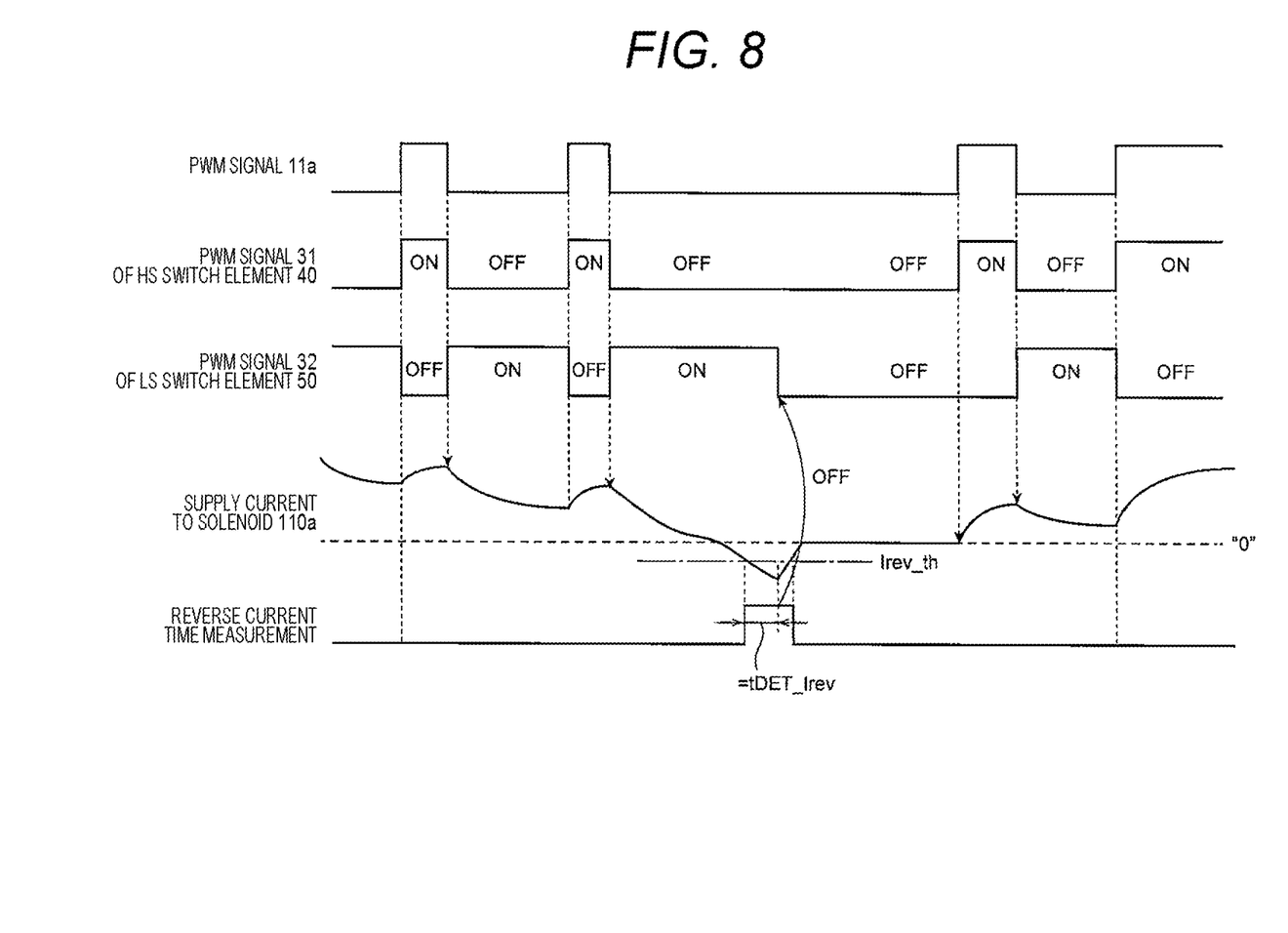
FIG. 8 is a view illustrating an operation waveform example of the second embodiment of the present invention.

That is, as illustrated in an operation timing chart of FIG. 8, if the reverse current equal to or larger than the certain current threshold Irev_th is detected for a certain time threshold tDET_Irev or longer and it is detected that a current in the reverse direction from the normal direction flows through the low-side switch element 50 by a determination threshold (predetermined current) or more by using the comparator 71 and the reverse current time measurement circuit 72, the PWM signal 32 is negated at that time, and the low-side switch element 50 is temporarily turned off by the switch control circuit 30 to cut off the reverse current.

Incidentally, the configuration illustrated in FIG. 7 is an example, and other configurations may be adopted as long as it can be detected that the current in the reverse direction from the normal direction flows through the low-side switch element 50 by the predetermined current or more.

In this manner, according to the second embodiment, the LS current measurement circuit 70 that measures the current value supplied to the solenoid 110a is provided, and the switch control circuit 30 has a function of temporarily turning off the low-side switch element 50 while keeping the high-side switch element 40 off when the LS current measurement circuit 70 detects that the current in the reverse direction from the normal direction flows by the predetermined current or more. That is, in a case where a certain reverse current is detected when the low-side switch element 50 is turned on, the low-side switch element 50 is turned off to cut off a further current path in the reverse direction.

As a result, it is possible to reliably prevent the occurrence of an unintended valve operation due to the flow of the reverse current. As a result, in the solenoid that controls disconnection of a lock-up clutch, it is possible to suppress the occurrence of a shift shock while preventing fastening of an unintended lock-up when a ground line is disconnected, for example, which is similar to the first embodiment.

Incidentally, the present invention is not limited to the above-described embodiments, and includes various modifications. For example, the above-described embodiments have been described in detail in order to describe the present invention in an easily understandable manner, and are not necessarily limited to one including the entire configuration that has been described above. In addition, some configurations of a certain embodiment can be substituted by configurations of another embodiment, and further, a configuration of another embodiment can be added to a configuration of a certain embodiment.

In addition, only a control line and a signal line considered to be necessary for the description have been illustrated, and all control lines and signal lines required for a product are not illustrated.

REFERENCE SIGNS LIST 10, 10a, 10b load drive circuit
11, 11a, 11b PWM signal
20 HS/LS control time measurement circuit (time measurement circuit)
30 switch control circuit
31 high-side switch element control PWM signal
32 low-side switch element control PWM signal
40 high-side switch element
50 low-side switch element
60 HS current measurement circuit
70 LS current measurement circuit
71 comparator
72 reverse current time measurement circuit
80 current calculation circuit
100 current control device
110, 110a, 110b solenoid
120 solenoid ground power source
150 battery power source
160 current control device ground power source
170 current control device ground connection node
200 microcontroller (microcomputer)

The invention claimed is:

1. A current control device comprising:
a high-side switch element that electrically connects a solenoid, which has one end grounded to a ground power source, to a battery power source;
a low-side switch element that electrically connects the solenoid to the ground power source;
a switch control circuit that controls a supply current with respect to the solenoid by turning on one of the high-side switch element and the low-side switch element and turning off a remaining one of the high-side switch element and the low-side switch element; and
a time measurement circuit that measures an ON duration of the low-side switch element, wherein
when the ON duration of the low-side switch element reaches a predetermined time, the low-side switch element is temporarily turned off while keeping the high-side switch element off.

2. The current control device according to claim 1, wherein
a state where both the high-side switch element and the low-side switch element are turned off is held until a control command for turning on the high-side switch element is generated after temporarily turning off the low-side switch element.

3. The current control device according to claim 1, wherein
in a case where a control command for turning on the high-side switch element is generated after temporarily turning off the low-side switch element, a state where both the high-side switch element and the low-side switch element are turned off is continued if an ON duration of the high-side switch element is shorter than a predetermined time.

4. The current control device according to claim 3, wherein
the predetermined time, which is a determination threshold of the ON duration of the high-side switch element, is set based on an ON period of the high-side switch element when a current value supplied to the solenoid is controlled to zero.

5. The current control device according to claim 1, wherein
the ON duration of the low-side switch element, which is a threshold for temporarily turning off the low-side switch element, is set to be equal to or longer than an ON/OFF switching cycle of the low-side switch element and the high-side switch element.

6. The current control device according to claim 1, wherein
the ON duration of the low-side switch element, which is a threshold for temporarily turning off the low-side switch element, is set to a time in which a stress generated by cutting off a current flowing from the low-side switch element to the solenoid decreases to a current value within an allowable range of the current control device.

7. The current control device according to claim 1, wherein the low-side switch element is a MOSFET.

8. The current control device according to claim 1, wherein the solenoid is a solenoid that controls disconnection of a lock-up clutch.

9. A current control device comprising:
a high-side switch element that electrically connects a solenoid, which has one end grounded to a ground power source, to a battery power source;
a low-side switch element that electrically connects the solenoid to the ground power source;
a switch control circuit that controls a supply current with respect to the solenoid by turning on one of the high-side switch element and the low-side switch element and turning off a remaining one of the high-side switch element and the low-side switch element; and
a time measurement circuit that measures an ON duration of the low-side switch element, wherein
in a case where a control command for turning on the high-side switch element is generated during measurement of the ON duration of the low-side switch element, the measurement of the ON duration of the low-side switch element is continued without being stopped if an ON duration of the high-side switch element is shorter than a predetermined time.

10. The current control device according to claim 9, wherein
the predetermined time, which is a determination threshold of the ON duration of the high-side switch element, is set based on an ON period of the high-side switch element when a current value supplied to the solenoid is controlled to zero.

11. A current control device comprising:
a high-side switch element that electrically connects a solenoid, which has one end grounded to a ground power source, to a battery power source;
a low-side switch element that electrically connects the solenoid to the ground power source;
a switch control circuit that controls a supply current with respect to the solenoid by turning on one of the high-side switch element and the low-side switch element and turning off a remaining one of the high-side switch element and the low-side switch element;
a time measurement circuit that measures an ON duration of the low-side switch element, and a current measurement circuit that measures a current value supplied to the solenoid, wherein the switch control circuit has a function of temporarily turning off the low-side switch element while keeping the high-side switch element off when the current measurement circuit detects that a current in a reverse direction from a normal direction flows by a predetermined current or more.

* * * * *